United States Patent
Lee et al.

(10) Patent No.: US 7,820,340 B2
(45) Date of Patent: Oct. 26, 2010

(54) LASER INDUCED THERMAL IMAGING (LITI) MASK AND AN ORGANIC ELECTROLUMINESCENT DEVICE FABRICATION METHOD USING THE MASK

(75) Inventors: Jae-Ho Lee, Suwon-si (KR); Tae-Min Kang, Suwon-si (KR); Seong-Taek Lee, Suwon-si (KR); Jin-Soo Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1104 days.

(21) Appl. No.: 11/501,059

(22) Filed: Aug. 9, 2006

(65) Prior Publication Data

US 2007/0034866 A1    Feb. 15, 2007

(30) Foreign Application Priority Data

Aug. 12, 2005    (KR)    ........................ 10-2005-0074364

(51) Int. Cl.
*H01J 9/227*    (2006.01)
*H01J 1/62*    (2006.01)

(52) U.S. Cl. ............................ 430/5; 430/200; 313/504

(58) Field of Classification Search ........................ None
See application file for complete search history.

(56) References Cited

U.S. PATENT DOCUMENTS

| | | | |
|---|---|---|---|
| 5,707,765 A | 1/1998 | Chen | |
| 2005/0012449 A1* | 1/2005 | Boroson et al. | 313/504 |
| 2005/0048295 A1 | 3/2005 | Kim et al. | |
| 2005/0115503 A1 | 6/2005 | Hagiwara et al. | |

FOREIGN PATENT DOCUMENTS

| | | |
|---|---|---|
| JP | 2002-222694 | 8/2002 |
| JP | 2003168569 | 6/2003 |
| JP | 2003-255508 | 9/2003 |
| JP | 2005026237 | 1/2005 |
| JP | 2005038833 | 2/2005 |
| JP | 2005085799 | 3/2005 |
| JP | 2005-166661 | 6/2005 |
| JP | 2005202418 | 7/2005 |

OTHER PUBLICATIONS

European Search Report for European Patent Application No. 06254231.0-2304 issued on Dec. 12, 2006.

* cited by examiner

*Primary Examiner*—John A. McPherson
(74) *Attorney, Agent, or Firm*—Robert E. Bushnell, Esq.

(57) ABSTRACT

A Laser Induced Thermal Imaging (LITI) mask and an organic electroluminescent device fabrication method using the mask provides a LITI mask in which corner regions are reinforced to improve adhesive force between a receptor substrate and a transfer layer on corners of a pixel portion of the receptor substrate, and an organic electroluminescent device fabrication method using such a LITI mask.

20 Claims, 16 Drawing Sheets

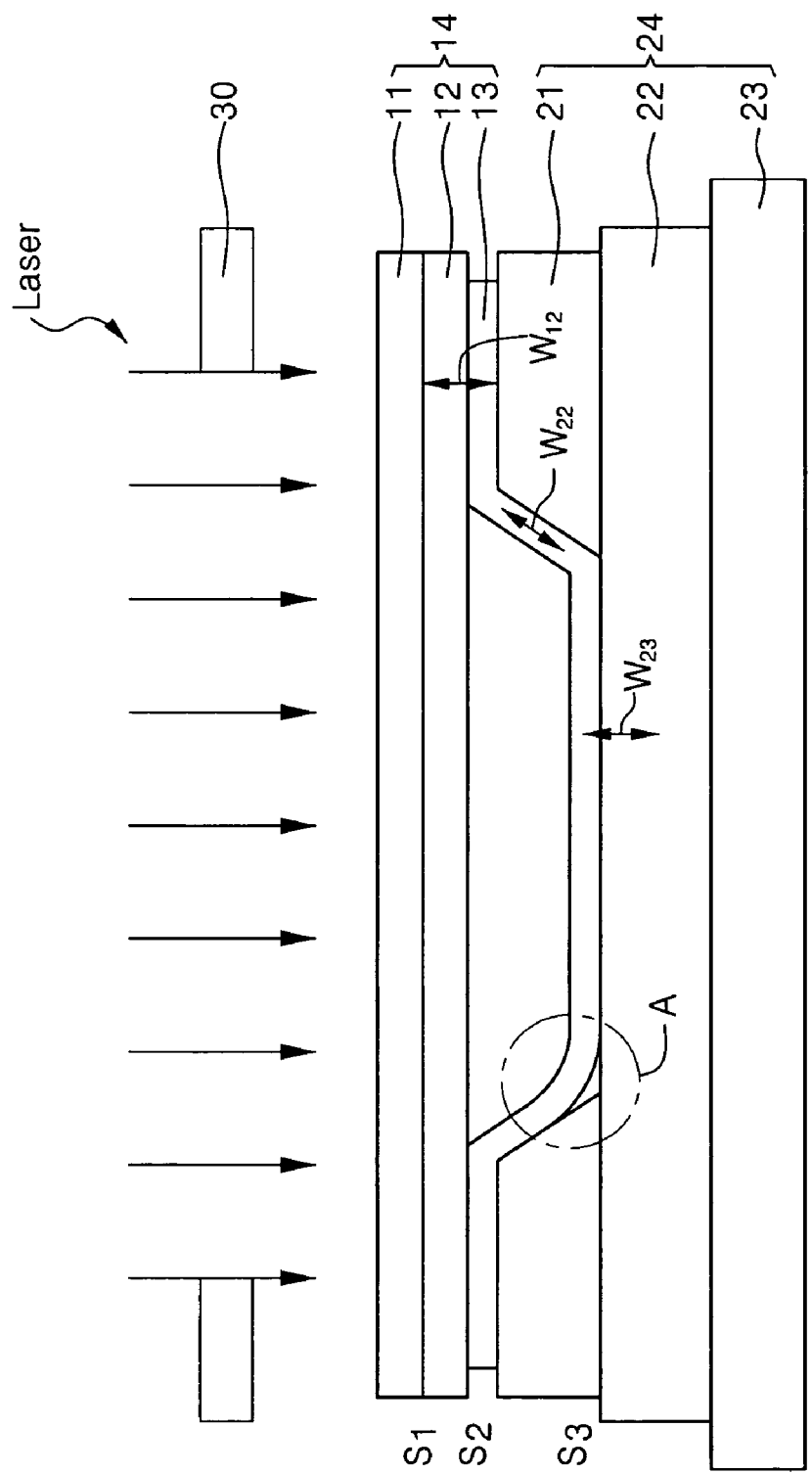

LASER INDUCED THERMAL IMAGING (LITI) MASK AND AN ORGANIC ELECTROLUMINESCENT DEVICE FABRICATION METHOD USING THE MASK

CLAIM OF PRIORITY

This application makes reference to, incorporates the same herein, and claims all benefits accruing under 35 U.S.C. §119 from an application entitled MASK FOR LASER IRRADIATION DEVICE AND FABRICATION METHOD OF ORGANIC ELECTROLUMINESCENCE DISPLAY DEVICE USING THE SAME, earlier filed in the Korean Intellectual Property Office on the 12 Aug. 2005 and there duly assigned Serial No. 2005-0074364.

BACKGROUND OF THE INVENTION

1. Field of the Invention

The present invention relates to a Laser Induced Thermal Imaging (LITI) mask and an organic electroluminescent device fabrication method using the mask. More particularly, the present invention relates to a LITI mask in which corner regions are reinforced, and an organic electroluminescent device fabrication method using the mask.

2. Description of the Related Art

An organic electroluminescent device in flat panel displays has merit as a moving picture display media irrespective of the size of the display since the organic electroluminescent device has a high response speed of 1 ms or less, consumes less electrical power than other devices and does not have a viewing angle problem due to its self-light emitting characteristics. Furthermore, the organic electroluminescent device is being considered as a next generation flat panel display because it can be fabricated at a low temperature and is simply fabricated based on an existing semiconductor process technology.

A patterning technology of an organic film composing the organic electroluminescent device is important in the organic electroluminescent device. In the organic layer patterning technology, the Laser Induced Thermal Imaging (LITI) method has excellent pattern uniformity and is advantageous in scaling-up of the organic film.

The LITI method has excellent inner uniformity of pixels when the organic film is scaled up since spin coating characteristics are used in the LITI method as is. Furthermore, the LITI method is capable of solving a problem of life deterioration of device by preventing damage of the organic film due to a solvent since the LITI method is not a wet process, but is rather a dry process. Additionally, the LITI method has merit in that the organic film can be finely patterned.

In order to apply the LITI method, a light source and an organic electroluminescent device substrate, i.e., a substrate and a donor substrate, are required, and the donor substrate includes a substrate layer, a light to heat conversion layer and a transfer layer. The LITI method includes a step of absorbing light coming out of the light source into the light to heat conversion layer of the donor substrate such that light is converted into thermal energy, and a step of transferring an organic material formed on the transfer layer by the converted thermal energy to the substrate such that the organic film is formed.

In a process of forming organic layer patterns by a LITI method, a donor substrate is laminated with a receptor substrate on which a prescribed device is formed; the donor substrate includes a substrate layer, a light to heat conversion layer and a transfer layer formed of a material composing an organic layer to be patterned. The receptor substrate sequentially includes a substrate, a pixel electrode pattern and a pixel defining layer; the pixel defining layer includes an opening for exposing a prescribed portion of the pixel electrode pattern.

The organic film is patterned by transferring an organic film using a laser such that the organic film is separated from a portion which does not receive laser energy while the organic film is being transferred to a receptor substrate after an organic film adhered to the substrate comes off from a donor substrate by the action of laser energy passing through a mask having a shape to be patterned.

The transfer characteristics are determined by a first adhesive force between the receptor substrate and a transfer layer a cohesive force between the transfer layers and a second adhesive force between the transfer layer and a substrate; the cohesive force between the transfer layers should be lower than adhesive force between the respective substrates and the transfer layer in order to improve laser transfer characteristics.

While a transfer layer of a region in which a laser beam is irradiated on the donor substrate is reaching a receptor substrate, the transfer layer comes off due to the degree of ductility of the donor substrate and the surface level difference of the receptor substrate; the transfer layer comes off severely particularly on a portion including an apex on one side of the receptor substrate. A contact area of the receptor substrate and the transfer layer separated from the donor substrate is small on the one portion including an apex on one side of the receptor substrate compared with other regions. Therefore, on the one portion A including an apex on one side of the receptor substrate, the foregoing second adhesive force, that is, adhesive force between the receptor substrate and the transfer layer is deteriorated.

The cohesive force between the transfer layers can be higher than the first adhesive force on the portion including an apex on one side of the receptor substrate during a process of adsorbing the donor substrate from the receptor substrate after being irradiated by a laser beam. Therefore, an organic layer pattern is unevenly formed on a portion A including an apex on one side of a pixel portion to result in deterioration of picture quality or the generation of an opening defect in which a prescribed portion of the pixel portion is open on a portion of the organic layer pattern.

A photolithography mask equipped with a serif for solving the rounding defect when a rounding defect is formed on a semiconductor integrated circuit pattern is suggested in U.S. Pat. No. 5,707,765. However, the photolithography mask discussed therein is equipped with a serif that is a reinforced region on the edge of a mask pattern to supplement rounding of the pattern caused by an optical problem generated during a fine patterning process, i.e., a proximity effect generated on a portion of pattern due to light diffraction. However, there is a difference on the design aspect when solving an opening defect formed since the adhesive force of the edge is deteriorated by a surface level difference of the receptor substrate during a process of forming an organic layer pattern by the LITI method.

SUMMARY OF THE INVENTION

Therefore, in order to solve the foregoing problems, it is an object of the present invention to provide a mask for Laser Induced Thermal Imaging (LITI) capable of reducing opening defects on the edge of an organic film by improving the adhesive force between a receptor substrate and a transfer layer on a portion of a pixel portion of the receptor substrate, and an organic electroluminescent device fabricating method using the mask.

In order to achieve the foregoing object, the present invention provides a Laser Induced Thermal Imaging (LITI) mask including: a first pattern portion; and a second pattern portion arranged on a portion including an apex on at least one side of the first pattern portion; the second pattern portion has area in a range of 8 to 8,500 μm².

The second pattern portion is projected 2 to 30 μm from the portion that includes the apex on at least one side of the first pattern portion. A length of one surface of the second pattern portion is in a range of 4 to 60 μm. The second pattern portion surrounds the apex of the first pattern portion. The second pattern portion has a curved shape. The second pattern portion has a circular shape having a radius in a range of 4 to 60 μm and centered around the apex of the first pattern portion.

The LITI mask is applied to a LITI device equipped with an equal-magnification projection lens. The LITI mask has one of a stripe, mosaic or delta shape.

In order to achieve the foregoing object, the present invention also provides a Laser Induced Thermal Imaging (LITI) mask including: a first pattern portion; and a second pattern portion arranged on a portion including an apex on at least one side of the first pattern portion; the second pattern portion has length in a range of 2 to 30 μm from the portion that includes the apex on at least one side of the first pattern portion.

The second pattern portion has length in a range of 4 to 60 μm.

The LITI mask is applied to a LITI device equipped with an equal-magnification projection lens. The LITI mask has one of a stripe, mosaic or delta shape.

In order to achieve the foregoing object, the present invention further provides a method of fabricating an organic electroluminescent device including: forming a first electrode on a substrate; laminating a donor substrate onto an upper portion of the first electrode formed on the substrate; forming an organic layer pattern by irradiating a laser beam passing through a Laser Induced Thermal Imaging (LITI) mask including a first pattern portion; and a second pattern portion arranged on a portion including an apex on at least one side of the first pattern portion; wherein the second pattern portion has area in a range of 8 to 8,500 μm² on the donor substrate; and forming a second electrode on an upper portion of the organic layer pattern; a reinforced region having an area in a range of 8 to 8,500 μm² is formed on a portion including an apex on at least one side of the organic layer pattern.

The organic layer pattern is formed with a laser generator and a laser irradiation apparatus including an equal-magnification projection lens. The organic layer pattern is formed in a pattern shape of the LITI mask.

In order to achieve the foregoing object, the present invention still further provides a organic electroluminescent device including: forming a first electrode on a substrate; forming an organic layer pattern including at least an emitting layer on the first electrode; and forming a second electrode on the organic layer pattern; forming a reinforced region having an area in a range of 8 to 8,500 μm² on a portion including an apex on at least one side of the organic layer pattern.

In order to achieve the foregoing object, the present invention also provides a method of fabricating an organic electroluminescent device including: forming a first electrode on a substrate; laminating a donor substrate onto an upper portion of the first electrode formed on the substrate; forming an organic layer pattern by irradiating a laser beam passing through the Laser Induced Thermal Imaging (LITI) mask including: a first pattern portion; and a second pattern portion arranged on a portion including an apex on at least one side of the first pattern portion; the second pattern portion has area in a range of 8 to 8,500 μm² on the donor substrate and wherein a length of one surface of the second pattern portion is in a range of 4 to 60 μm; and forming a second electrode on an upper portion of the organic layer pattern; a reinforced region having an area in a range of 8 to 8,500 μm² is formed on a portion including an apex on at least one side of the organic layer pattern.

The organic layer pattern is formed with a laser generator and a laser irradiation apparatus including an equal-magnification projection lens. The organic layer pattern is formed in a pattern shape of the LITI mask.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein:

FIG. 1A to FIG. 1E are views for explaining a process of forming an organic layer pattern by a Laser Induced Thermal Imaging (LITI) method;

DETAILED DESCRIPTION OF THE INVENTION

FIG. 1A to FIG. 1E are views for explaining a process of forming organic layer patterns by a Laser Induced Thermal Imaging (LITI) method.

Figure 1A:
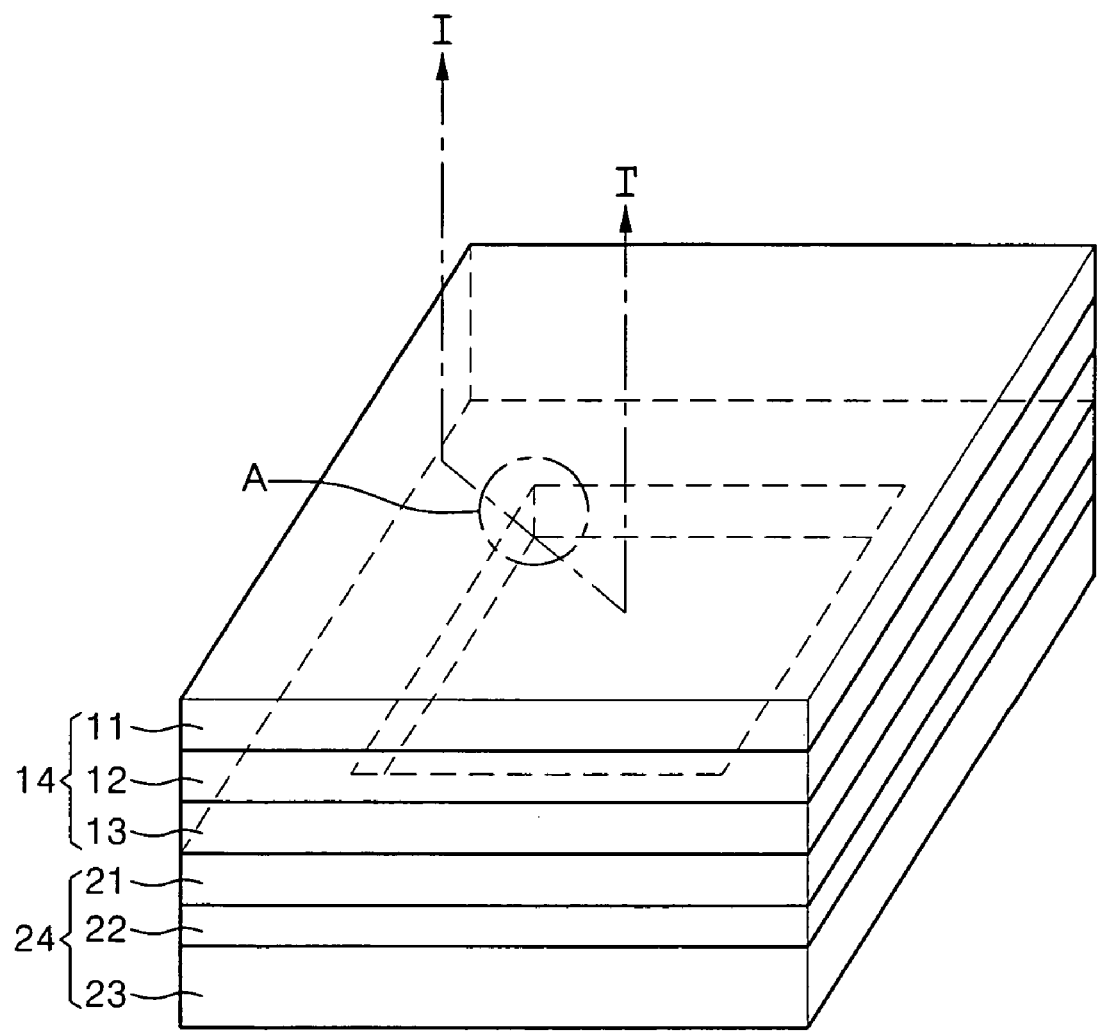
Figure 1B:
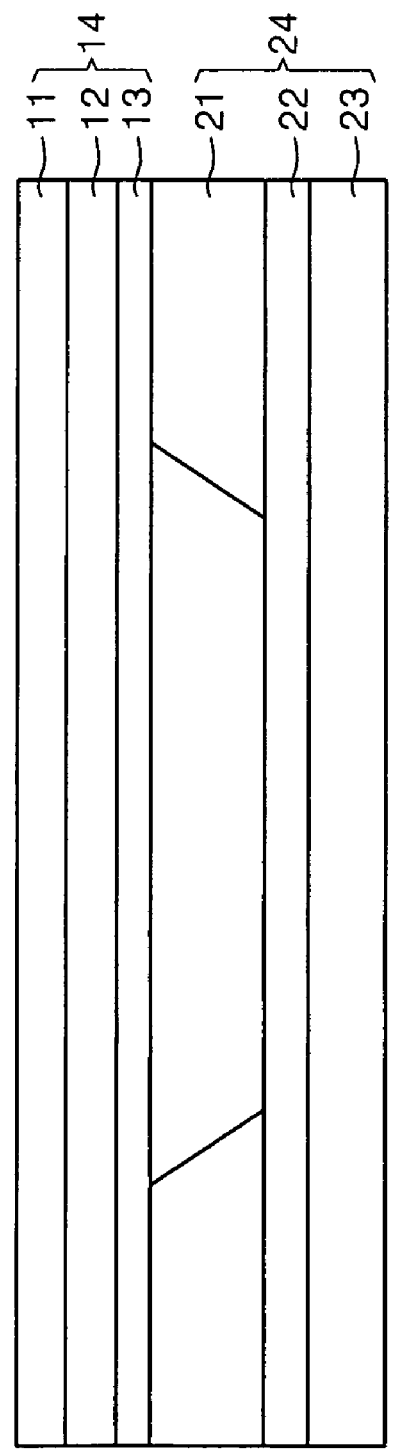

FIG. 1A is a plan figure in which a donor substrate is laminated with a receptor substrate, and FIG. 1B is a cross-sectional view taken along a line I-I' of FIG. 1A.

As illustrated in FIG. 1A and FIG. 1B, a donor substrate 14 is laminated with a receptor substrate 24 on which a prescribed device is formed; the donor substrate 14 includes a substrate layer 11, a light to heat conversion layer 12 and a transfer layer 13 formed of a material composing an organic layer to be patterned. The receptor substrate 24 sequentially includes a substrate 23, a pixel electrode pattern 22 and a pixel defining layer 21; the pixel defining layer 21 includes an opening for exposing a prescribed portion of the pixel electrode pattern 22.

FIG. 1C is a cross-sectional view for explaining the process of transferring an organic film by a LITI method.

As illustrated in FIG. 1C, the organic film is patterned by transferring an organic film using a laser such that the organic film S2 is separated from a portion which does not receive laser energy while the organic film S2 is being transferred to a receptor substrate S3 24 after an organic film S2 13 adhered to the substrate S1 comes off from a donor substrate S1 by the action of laser energy passing through a mask 30 having a shape to be patterned.

The transfer characteristics are determined by a first adhesive force W12 between the receptor substrate S1 and a transfer layer S2, a cohesive force W22 between the transfer layers and a second adhesive force W23 between the transfer layer S2 and a substrate S3; the cohesive force between the transfer layers should be lower than adhesive force between the respective substrates and the transfer layer in order to improve laser transfer characteristics.

Figure 1D:
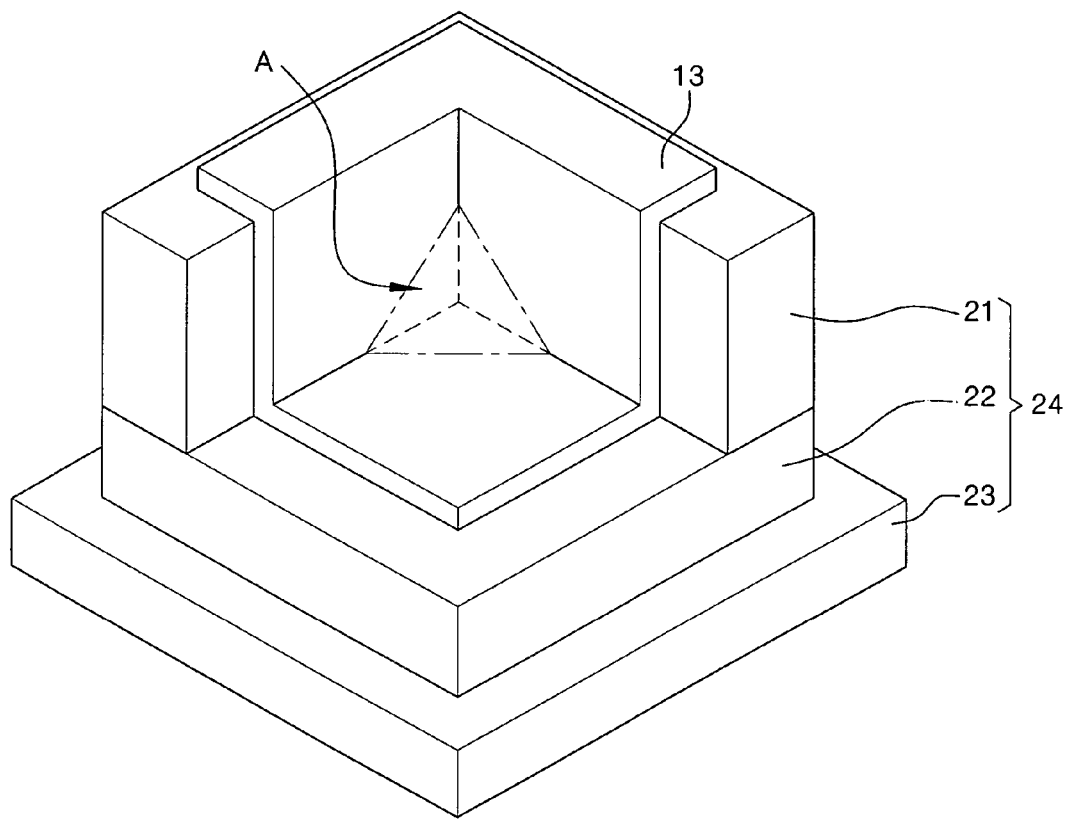

FIG. 1D is a plan figure of the expanded portion after expanding a portion A including an apex on one side after laser irradiation in FIG. 1C.

As illustrated in FIG. 1D, while a transfer layer 13 of a region in which a laser beam is irradiated on the donor substrate 14 in FIG. 1C is reaching a receptor substrate 24, the transfer layer comes off due to the degree of ductility of the donor substrate and the surface level difference of the receptor substrate; the transfer layer 13 comes off severely particularly on a portion A including an apex on one side of the receptor substrate 24. A contact area of the receptor substrate 24 and the transfer layer 13 separated from the donor substrate is small on the one portion A including an apex on one side of the receptor substrate 24 compared with other regions. Therefore, on the one portion A including an apex on one side of the receptor substrate 24, the foregoing second adhesive force, that is, adhesive force between the receptor substrate and the transfer layer is deteriorated.

Figure 1E:
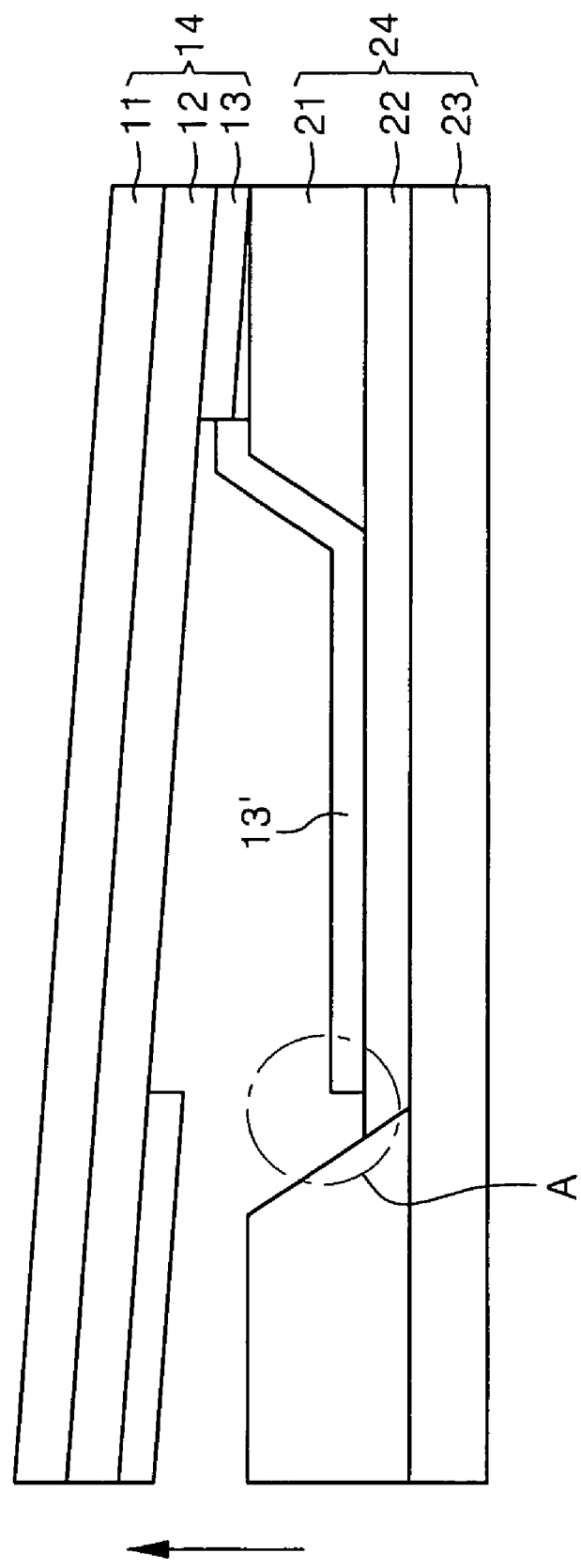

As illustrated in FIG. 1E, the cohesive force between the transfer layers can be higher than the first adhesive force on the portion A during a process of adsorbing the donor substrate from the receptor substrate 24 after being irradiated by a laser beam. Therefore, an organic layer pattern 13' is unevenly formed on a portion A including an apex on one side of a pixel portion to result in deterioration of picture quality or the generation of an opening defect in which a prescribed portion of the pixel portion is open on a portion of the organic layer pattern 13'.

The present invention is described below in detail in connection with exemplary embodiments with reference to the accompanying drawings. Like reference characters designate corresponding portions throughout several views. In the drawings, size, thickness, etc. of elements can be exaggerated for convenience of understanding.

Figure 2A:
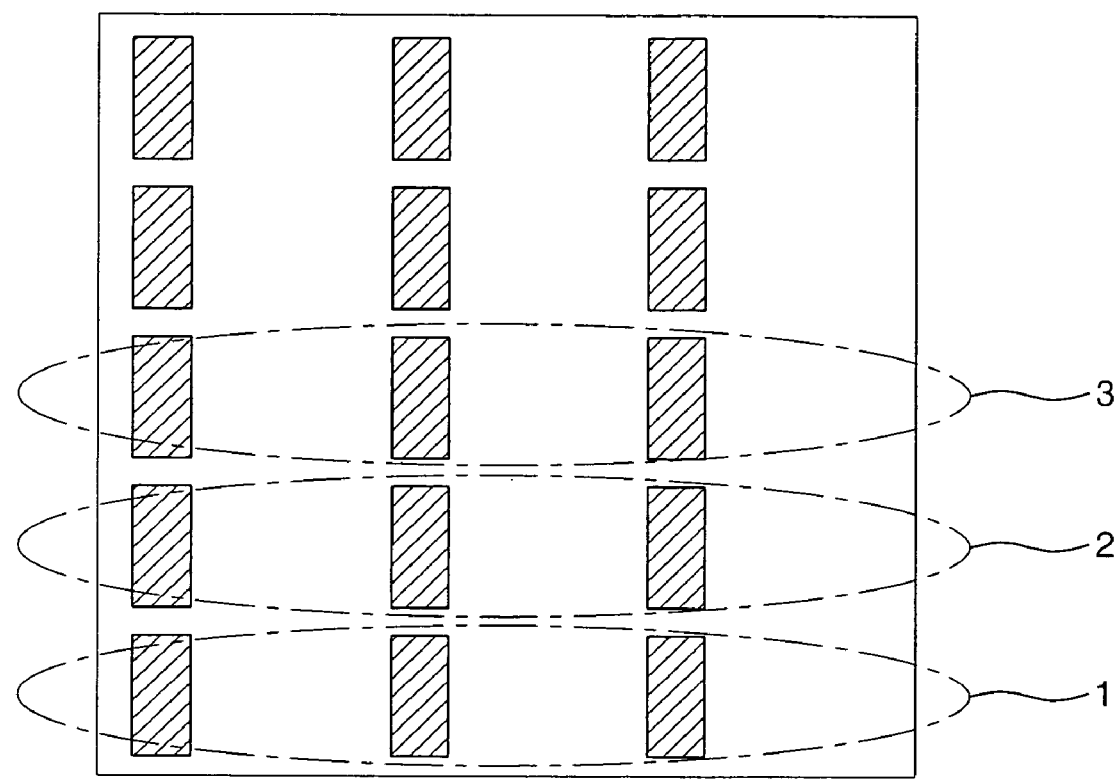
FIG. 2A to FIG. 2C are plane figures of various exemplary embodiments of a LITI mask for determining a shape of an organic layer pattern.
Figure 2B:
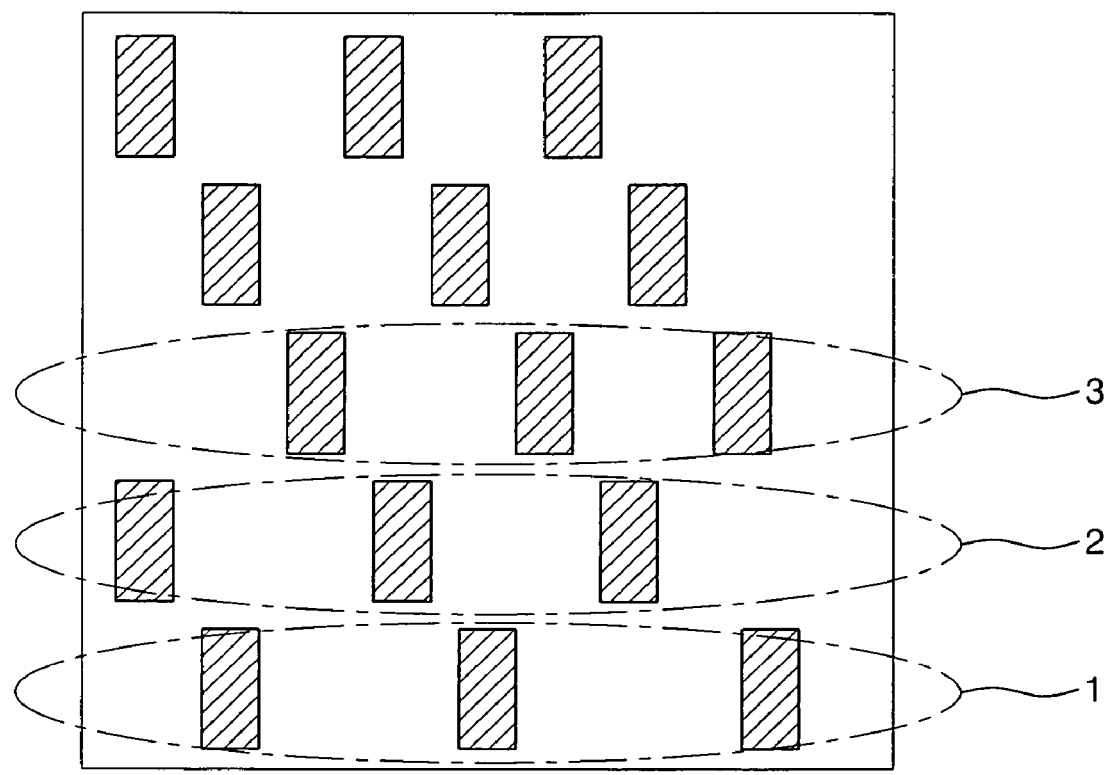
Figure 2C:
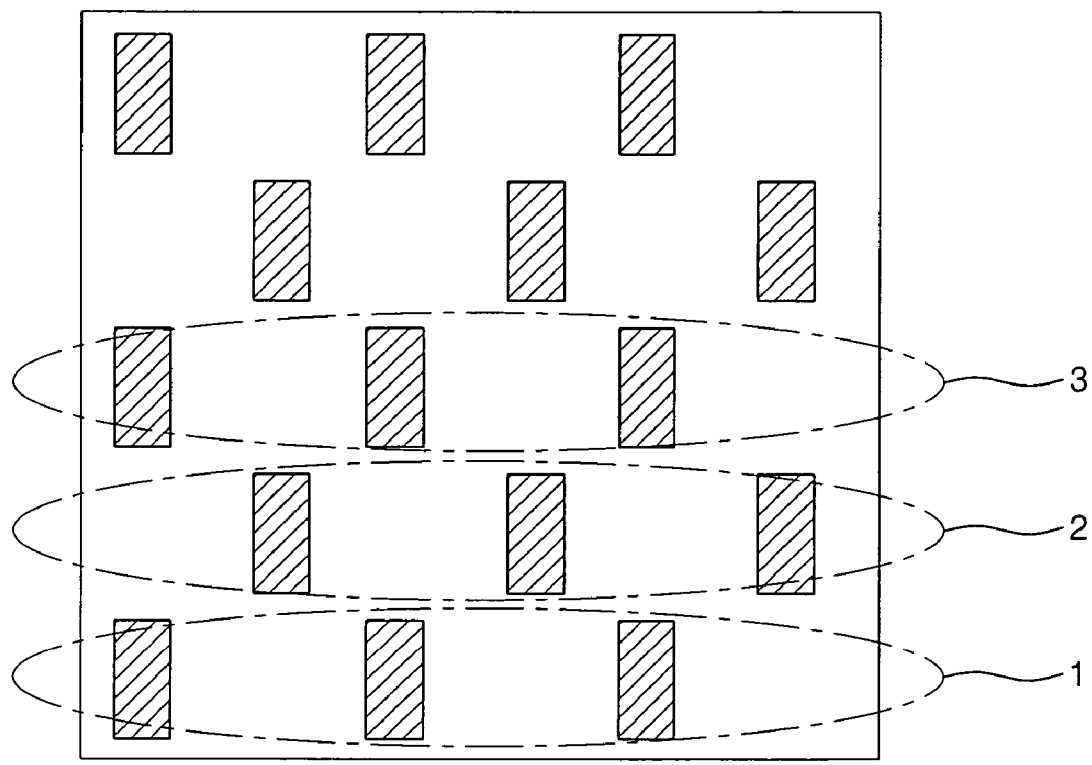

FIG. 2A to FIG. 2C are plan figures of various exemplary embodiments of a LITI mask for determining a shape of an organic layer pattern.

A pattern of the mask has a certain cycle and is formed in a stripe shape (FIG. 2A), mosaic shape (FIG. 2B) or delta shape (FIG. 2C) according to patterns of an emitting layer of an organic electroluminescent device.

The mask pattern has a cycle in which the same pattern as a first pattern group 1 is repeated in case of a stripe shaped mask of FIG. 2A, and the mask pattern is formed in a shape in which the first pattern group 1, a second pattern group 2 and a third pattern group 3 are repeated as one cycle in case of a mosaic shaped mask of FIG. 2B. Furthermore, the mask pattern is formed in a shape in which the first pattern group 1 and the second pattern group 2 are repeated as one cycle in case of a delta shaped mask of FIG. 2C.

Therefore, among the foregoing three shapes of the mask pattern, the mosaic shaped mask and the delta shaped mask are used to form an organic layer for a multicolored organic electroluminescent device, and the stripe shaped mask is used to form an organic layer for both a single colored organic electroluminescent device and a multicolored organic electroluminescent device.

With regard to the foregoing three masks, it is preferable to reinforce a portion including an apex on at least side of the mask pattern to prevent an opening defect from occurring on an edge region.

FIG. 3A to FIG. 3E are views for explaining various shaped patterns of a LITI mask capable of being applied according to exemplary embodiments of the present invention; the various shaped patterns of the LITI mask are explained are limited to the case in which a projection lens of a laser irradiation apparatus is an equal-magnification projection lens although it is not illustrated in the drawings. The masks are differently designed according to the magnification of the projection lens. For example, when a magnification of the projection lens is 2:1, the LITI mask is designed such that area of the mask is quadrupled, and length of the mask is doubled.

Figure 3A:
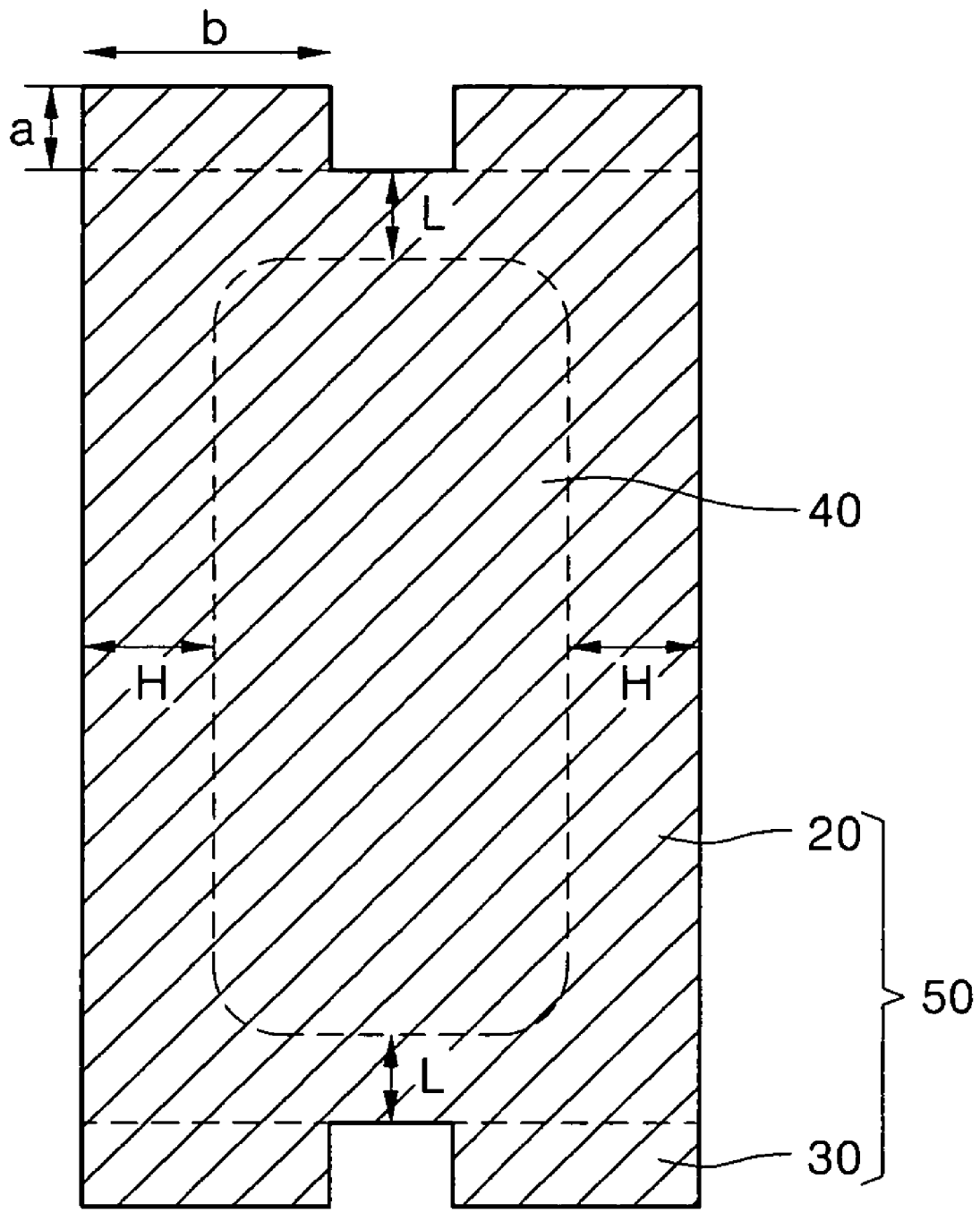
FIG. 3A to FIG. 3E are views for explaining various shaped patterns of a LITI mask capable of being applied according to exemplary embodiments of the present invention.

Referring to FIG. 3A, a laser beam passing through the mask is irradiated onto a pixel portion 40 in the same shape as the mask pattern 50.

The mask pattern 50 includes of a first pattern portion 20 having a prescribed shape that transmits light, and a second pattern portion 30 for reinforcing a portion including an apex on at least one side of the first pattern portion 20, wherein the second pattern portion 30 is preferably formed on the portion including an apex on at least one side of the first pattern portion 20. The second pattern portion 30 can be formed on the upper surface and the lower surface of the first pattern portion 20.

The first pattern portion 20 is designed such that the first pattern portion 20 is bigger than the pixel portion 40 considering misalignment of patterns. That is, length L and width H of the first pattern portion 20 are ordinarily extended 2 to 30 μm from respective side surfaces of the pixel portion 40. Considering that, it is preferable that length a of the second pattern portion 30 reinforced on the portion including an apex on at least one side of the first pattern portion is projected 2 to 30 μm from the portion including an apex on at least one side of the first pattern portion so as to prevent formation of an opening defect or uneven patterns due to deterioration of the adhesive force caused by decreasing the area of a transfer layer to be adhered to a receptor substrate after being separated from a donor substrate on the portion including an apex on at least one side of the first pattern portion as compared with other regions.

If the length a of the second pattern portion 30 reinforced on the portion including an apex on at least one side of the first pattern portion is projected 2 μm or less from the portion including an apex on at least one side of the first pattern portion, the area of the transfer layer to be adhered to the receptor substrate after being separated from the donor substrate is increased. However, the adhesive force between the transfer layer and a portion including an apex on one side of the receptor substrate is not improved enough to solve the foregoing problem. On the other hand, if the length a of the second pattern portion 30 reinforced on the portion including an apex on at least one side of the first pattern portion is projected 30 μm or more from the portion including an apex on at least one side of the first pattern portion, there is problem that the transfer layer can be overlapped with a pixel portion formed adjacently to the transfer layer although area of the transfer layer contacted with the receptor substrate after being separated from the donor substrate is increased such that uniform patterns are formed, and an opening defect is prevented from being formed.

Furthermore, length b of the second pattern portion 30 is preferably projected 4 to 60 μm from a portion including an apex on at least one side of the first pattern portion considering that the second pattern portion is capable of sufficiently preventing an opening defect from forming on corners.

An area range of the second pattern portion to be reinforced can be obtained. That is, the area of the second pattern portion 30 to be obtained is ab, wherein the area range of the second pattern portion is 8 to 1,800 µm² since a satisfies 2 µm<a<30 µm, and b satisfies 4 µm<b<60 µm. Namely, a prescribed shaped second pattern portion having the above area range is formed to prevent an opening defect from forming on a portion including an apex on at least one side due to the deterioration of the adhesive force.

Figure 3B:
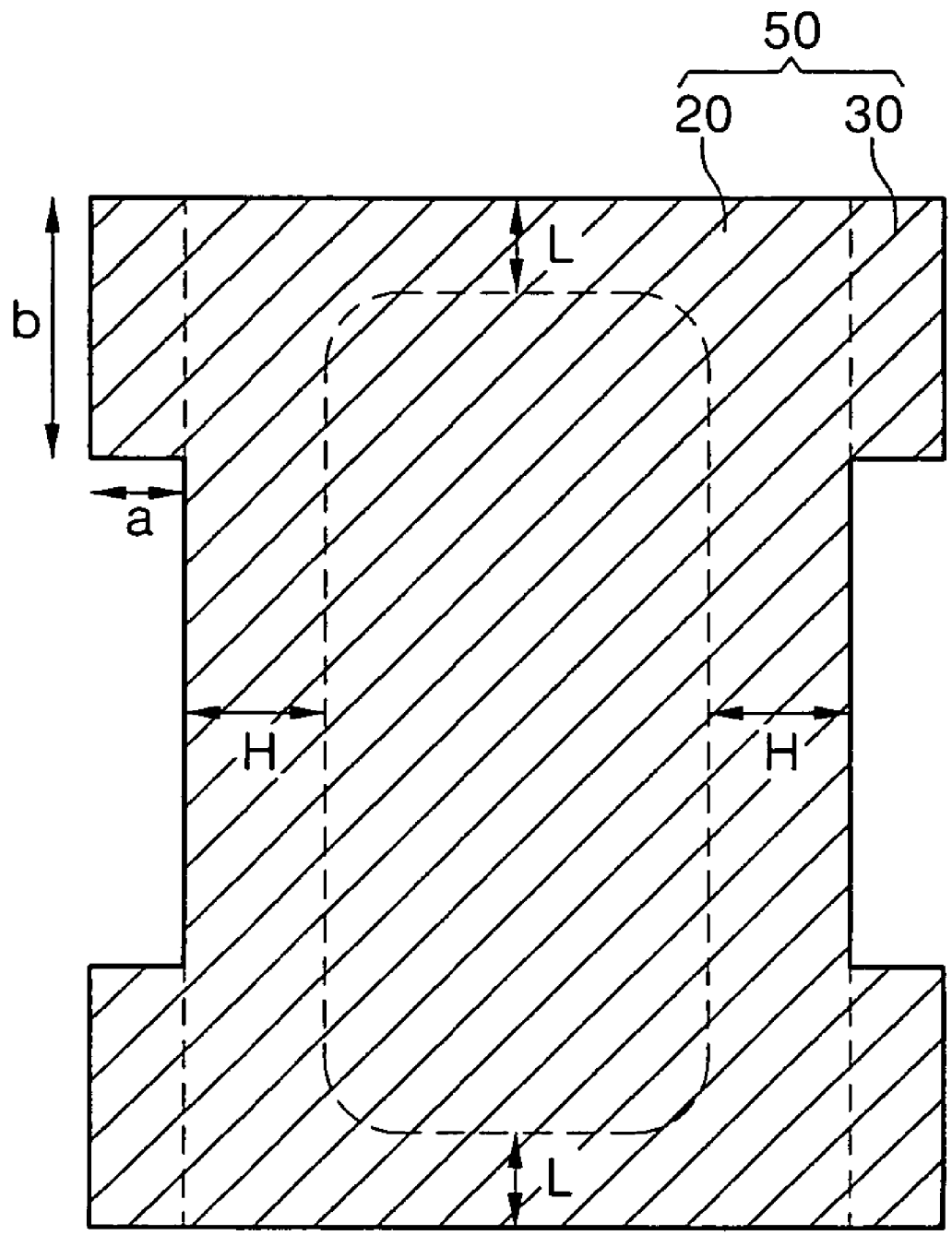

Since the same constitutional factors and reference numbers as in FIG. 3A are contained in FIG. 3B except for position of the second pattern portion 30, a repeated description has been omitted.

As illustrated in FIG. 3B, the second pattern portion 30 can be formed on the left side surface and the right side surface of the first pattern portion 20, wherein length a of the second pattern portion 30 reinforced on a portion including an apex on at least one side of the first pattern portion 20 is preferably projected 2 to 30 µm perpendicularly from corners. Furthermore, length b of the first pattern portion is preferably projected 4 to 60 µm from the portion including an apex on at least one side of the first pattern portion 20 to sufficiently prevent an opening defect from forming on the portion including an apex on at least one side of the first pattern portion 20.

Due to the same foregoing reason, the second pattern portion 30 reinforced on the portion including an apex on at least one side of the first pattern portion 20 preferably has an area of 8 to 1,800 µm² to prevent formation of an opening defect.

Figure 3C:
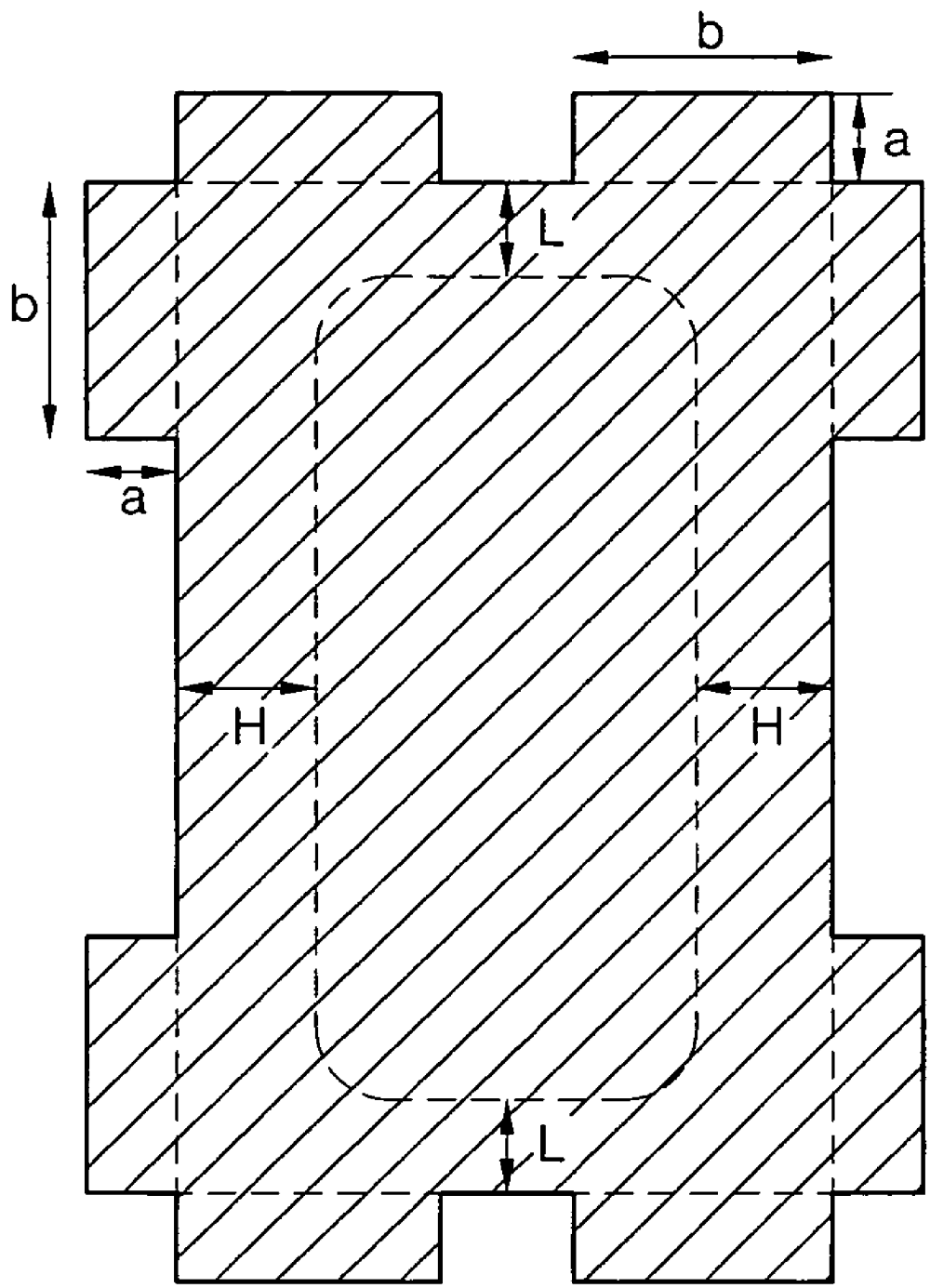

Since FIG. 3C constructed in a combined structure of FIG. 3A and FIG. 3B has the same constitutional factors and reference numbers as in FIG. 3A and FIG. 3B, a repeated description has been omitted.

As illustrated in FIG. 3C, second pattern portions 30 are formed on side surfaces of a portion including an apex on at least one side of a first pattern portion 20, wherein the area of the second pattern portion 30 reinforced on the portion including an apex on at least one side of the first pattern portion 20 is increased to a range of 16 to 3,600 µm² to further increase the adhesive force of a transfer layer separated from a substrate and a donor substrate on the portion including an apex on at least one side of the first pattern portion 20.

Figure 3D:
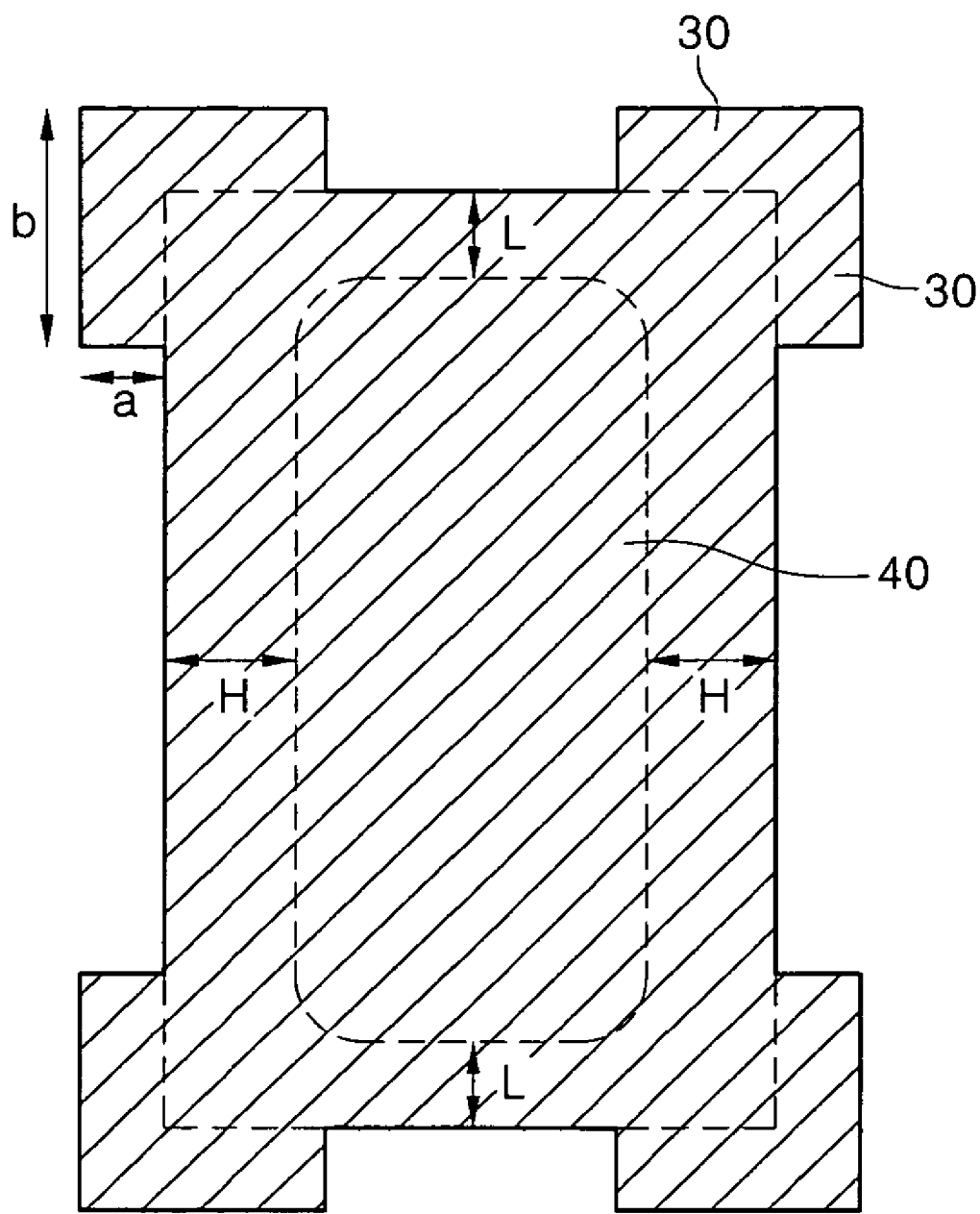

Since the same constitutional factors and reference numbers as in FIG. 3C are contained in FIG. 3D except that the second pattern portions formed on the side surfaces of the portion including an apex on at least one side of the first pattern portion 20 are overlapped with each other, a repeated description has been omitted.

As illustrated in FIG. 3D, the second pattern portions 30 are formed on the side surfaces of the portion including an apex on at least one side of the first pattern portion 20 such that portions of the second pattern portions are overlapped with the portion including an apex on at least one side of the first pattern portion 20. That is, the second pattern portion 30 is formed such that the second pattern portion 30 surrounds the portion including an apex on at least one side of the first pattern portion 20, wherein the second pattern portion 30 reinforced on the portion including an apex on at least one side of the first pattern portion 20 preferably has an area of 12 to 2,700 µm². Although the adhesive force of a transfer layer separated from a receptor substrate and a donor substrate is increased, an opening defect can be formed on the portion including an apex on at least one side of the first pattern portion 20. Therefore, the opening defect can be completely prevented from being formed by further forming an extra reinforcement region on the portion including an apex on at least one side of the first pattern portion 20.

Figure 3E:
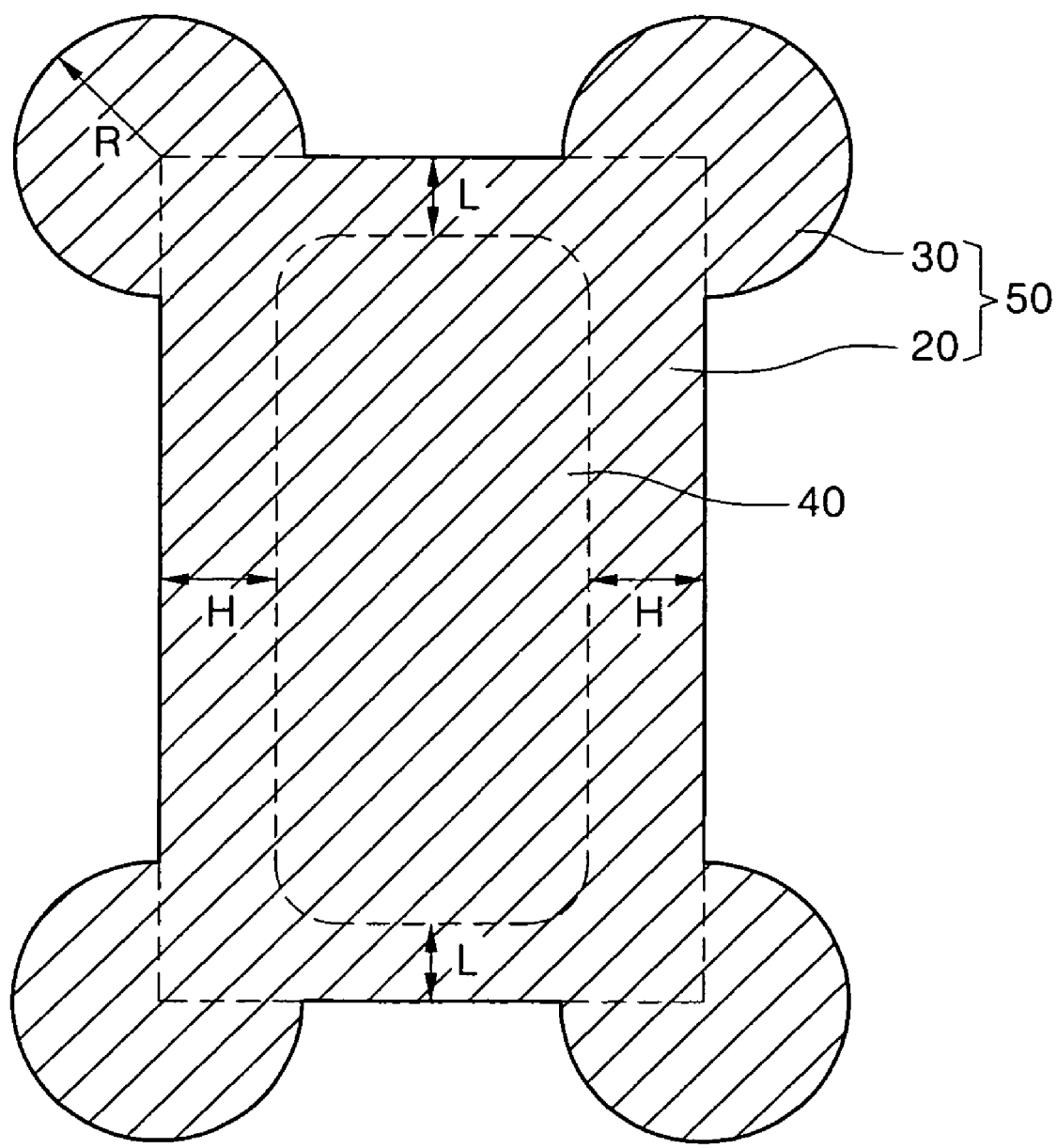

Since the same constitutional factors and reference numbers as in FIG. 3D are contained in FIG. 3E except that the second pattern portion is formed in a circular shape, a repeated description has been omitted.

The second pattern portion 30 is formed around an apex of the first pattern portion 20 in a circular shape such that a radius R of the second pattern portion 30 is L+H. That is, the radius R of the second pattern portion is from 4 to 60 µm, and the second pattern portion 30 has an area of 37 to 8,500 µm² to increase the adhesive force of a transfer layer separated from a receptor substrate and a donor substrate accordingly. Furthermore, more uniformed patterns can be formed by reinforcing the second pattern portion 30 in a circular shape on respective regions of a portion including an apex on one side such that the second pattern portion has uniform length, thereby giving a uniform adhesive force to corners.

Although the second pattern portion 30 is illustrated as a rectangular or circular shape in the drawings, the second pattern portion is not limited to the rectangular or circular shape since an organic layer pattern formed by the second pattern portion is a non-emitting region.

Figure 4A:
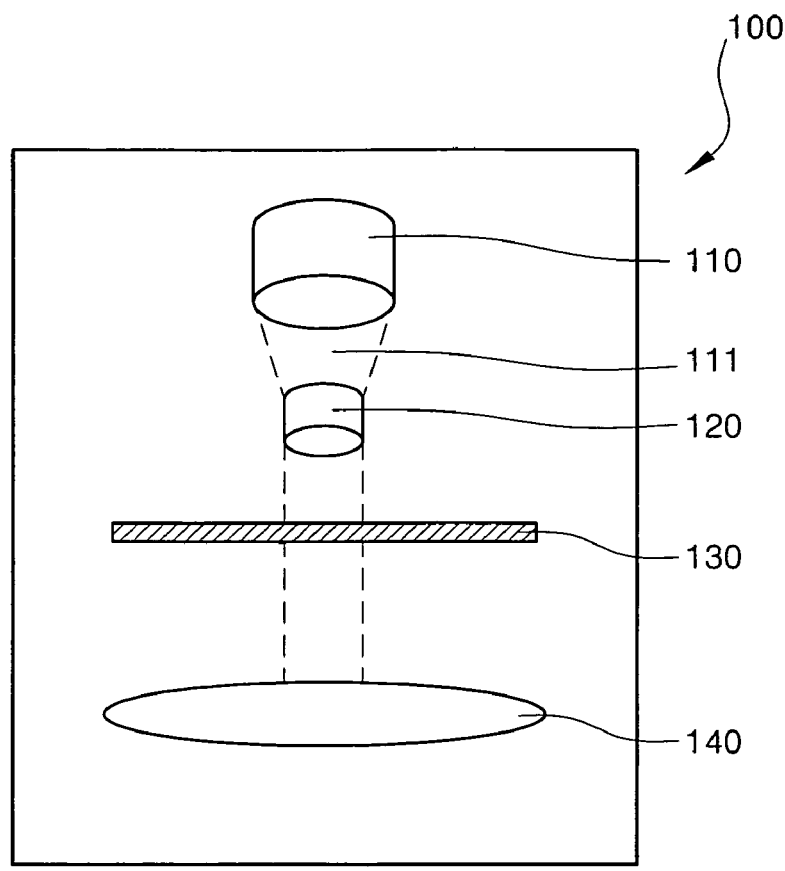
FIG. 4A to FIG. 4C are views for explaining a method of fabricating an organic electroluminescent device according to exemplary embodiments of the present invention.
Figure 4A:
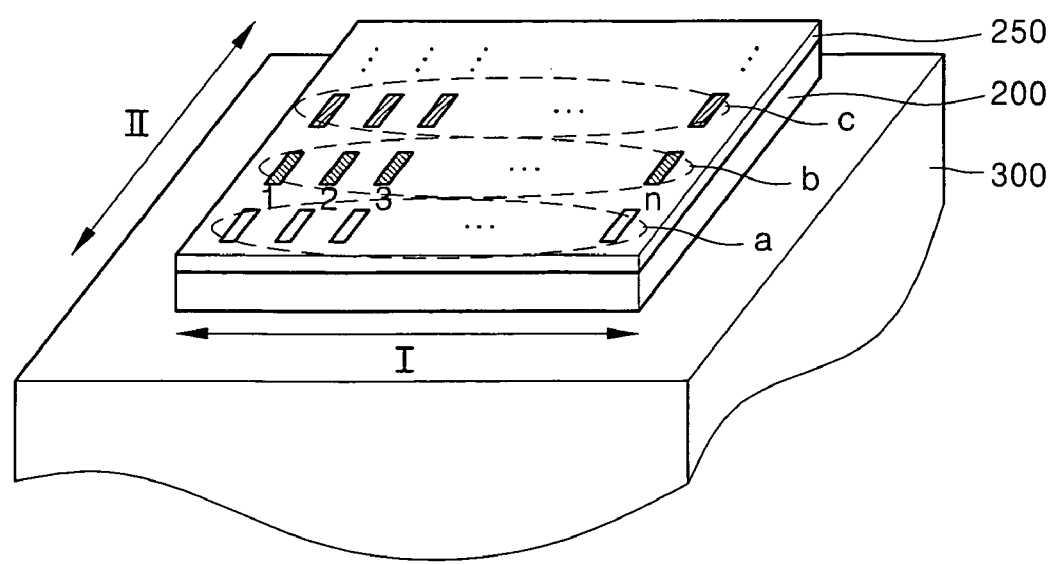
Figure 4B:
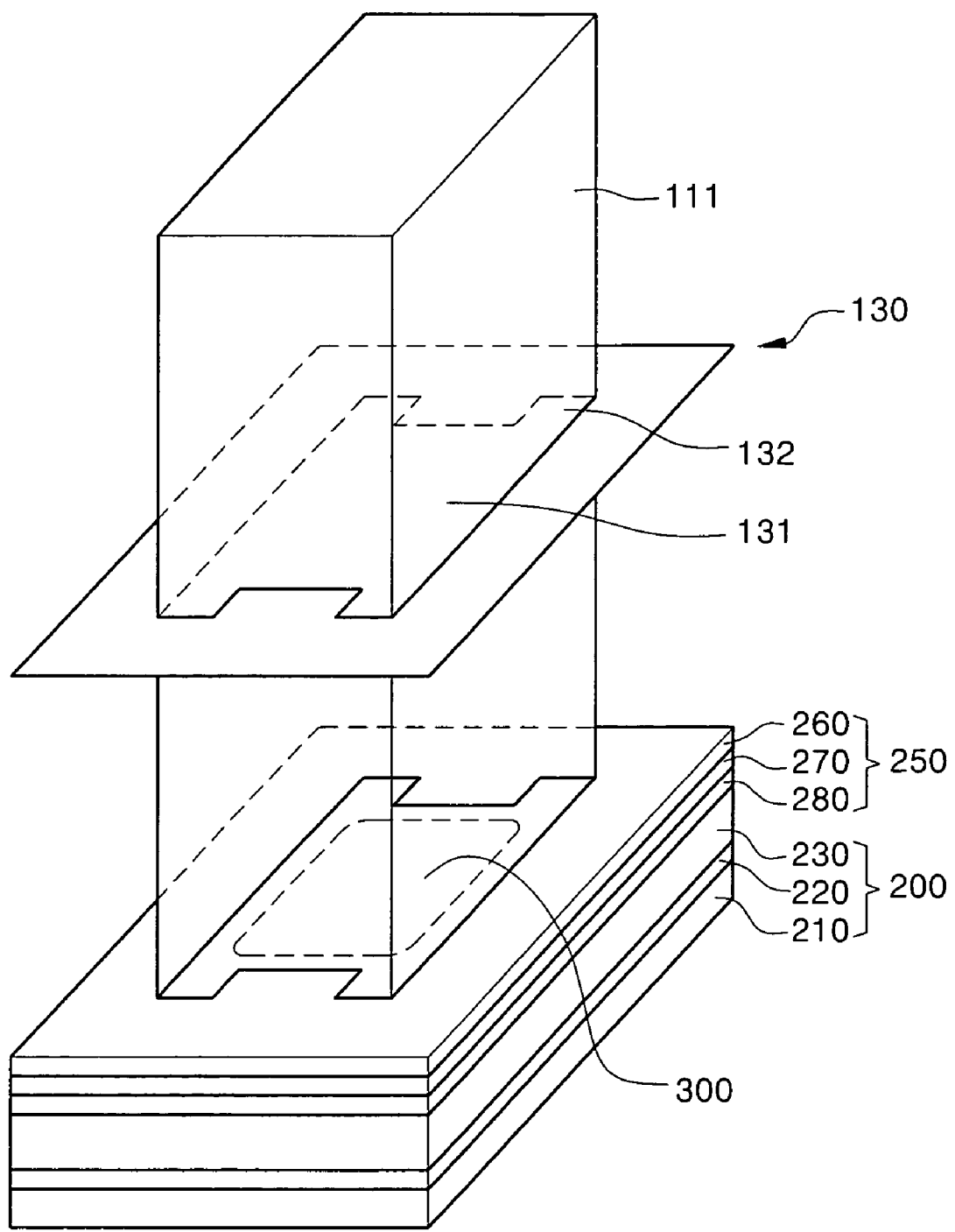
Figure 4C:
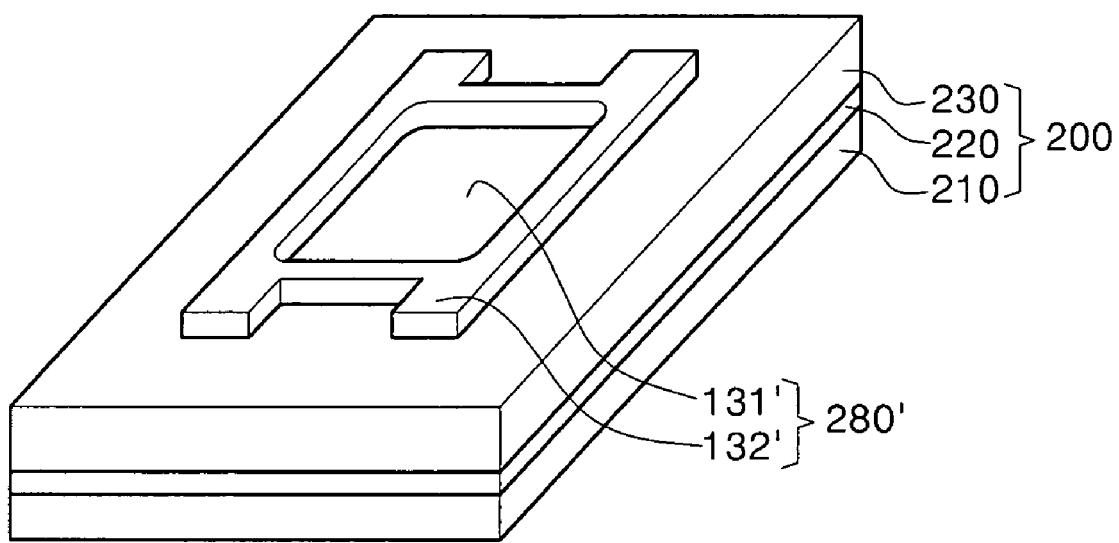

FIG. 4A to FIG. 4C are drawings for explaining an organic electroluminescent device fabrication method according to exemplary embodiments of the present invention.

Referring to FIG. 4A, a LITI device 100 includes a laser generator 110, a LITI mask 130 installed under the laser generator 10, and a projection lens 140; the LITI device 100 further includes a beam shaper, not illustrated in FIG. 4A, installed between the laser generator 110 and the LITI mask 130 to cause a uniform laser beam 111 to be irradiated from the laser generator 110.

A substrate 200 having a pixel electrode under the LITI device 100 is laminated with a donor substrate 250 having at least one transfer layer above the substrate 200.

Thereafter, a laser beam 111 is produced by the laser generator 110, and the laser beam 111 passes through the LITI mask 130 that is patterned in a prescribed shape; the laser beam 111 transmits a pattern group of the LITI mask 130 having patterns 1, 2, 3, . . . , n that are repeated in a certain cycle such that the laser beam is patterned in a shape of the LITI mask 130.

The laser beam 111 passing through the LITI mask 130 reaches the donor substrate by being transmitted through the projection lens.

A mosaic, delta or stripe shaped pattern is formed on an upper portion of the substrate 200 according to shape of the LITI mask.

Therefore, a first pattern group a is completed on an upper portion of the substrate 200 through the foregoing process.

After forming the first pattern group a, the LITI device is moved in a direction II, and the mask 130 installed in the LITI device is moved a fixed distance in a transfer direction I.

Thereafter, the laser beam is patterned by transmitting the laser beam 111 through a repeated pattern group of the mask 130, and a second pattern group b is formed on an upper portion of the substrate 200 by irradiating the patterned laser beam onto an upper portion of the donor substrate 250.

When the second pattern group b is formed on the upper portion of the substrate 200, the LITI device is again moved in the direction II, and the LITI mask 130 installed in the LITI device is again moved a fixed distance in the transfer direction I.

Thereafter, the laser beam is patterned by transmitting the laser beam 111 through a repeated pattern group of the LITI mask 130, and a third pattern group c is formed on an upper portion of the substrate 200 by irradiating the patterned laser beam onto an upper portion of the donor substrate 250.

The foregoing process is capable of moving the stage and the LITI mask 130 such that the movement of a stage 300 along the substrate is synchronized with the movement of the LITI mask 130 or moving the stage and the LITI mask 130 while respective groups are being moved one step at a time.

An organic film, illustrated in the drawings, is patterned on an upper portion of the substrate 200 when the transfer in the direction II has been completed by repeating the foregoing process.

The organic layer pattern can be an emitting layer. The organic layer pattern further includes one or more layers selected from the group consisting of a hole injection layer, a hole transport layer, a hole inhibition layer and an electron injection layer.

FIG. 4B and FIG. 4C are respective views of a donor substrate and a substrate laminated with a mask as perspective views for expanding one unit pixel A in FIG. 4A.

Referring to FIG. 4B, the foregoing LITI mask 130 includes a first pattern portion 131, and a second pattern portion 132 for reinforcing a portion including an apex on at least one side of the first pattern portion 131.

A laser beam 111 is irradiated onto the donor substrate 250 according to the shape of the first pattern portion 131 and the second pattern portion 132 of the LITI mask 130; the donor substrate 250 includes at least a substrate layer 260, a light to heat conversion layer 270 and a transfer layer 280. Furthermore, a receptor substrate 200 is laminated on a lower portion of the donor substrate 250. The receptor substrate 200 includes a substrate 210, a pixel electrode 220 formed on the substrate 210, and a pixel defining layer 230 formed on the pixel electrode 220 to define a pixel portion 300.

The laser beam 111 projected on the donor substrate 250 is absorbed into the light to heat conversion layer 270 of the donor substrate 250 such that the laser beam 111 absorbed into the light to heat conversion layer 270 is converted into heat. The heat has an effect on the transfer layer 280 such that the transfer layer is separated from the donor substrate 250 and transferred onto the pixel electrode 220 of the receptor substrate 200.

The transfer layer transferred onto the pixel electrode 220 can come off a portion including an apex on one side due to a surface level difference of the receptor substrate 200. Although an area of a transfer layer transferred onto the portion including an apex on one side can be decreased compared with area of a transfer layer transferred onto other regions, the area of a transfer layer transferred onto the portion including an apex on one side is not decreased by the second pattern 132 reinforced on a portion including an apex on at least one side of the first pattern portion 131 of the mask.

Thereafter, an adhesion area of a transfer layer transferred onto the portion including an apex on at least one side is increased during separation of the receptor substrate 200 and the donor substrate 250 to prevent an opening defect or uneven patterns from forming on a portion of the pixel electrode 220.

As illustrated in FIG. 4C, an organic layer 280' can be patterned and formed in a pattern shape of the mask on the pixel electrode 220. That is, a first organic layer pattern portion 131' is formed by a first pattern portion 131 in FIG. 4B of the mask. Furthermore, a second organic pattern portion 132' in which a portion including an apex on at least one side of the first organic layer pattern portion 131' is reinforced is formed by a second pattern portion 132 in FIG. 4B of the mask; the second organic pattern portion 132' does not have an effect on an organic electroluminescent device since the second organic pattern portion 132' is formed on a non-emitting portion.

A transfer process of forming an organic layer pattern by the LITI device can be performed in a nitrogen atmosphere to prevent the organic layer pattern from being oxidized by oxygen existing in the atmosphere; it is preferable to charge nitrogen gas ($N_2$) until an atmosphere containing 100 ppm of $O_2$ and 100 ppm of $H_2O$ is created considering conditions in which the organic film is not influenced by oxygen or moisture since a considerable amount of time and money have to be invested to create a nitrogen atmosphere.

Furthermore, the transfer process is performed in a vacuum atmosphere such that the generation of air bubbles between the donor substrate and the substrate can be suppressed during a process of laminating the donor substrate onto the front of the substrate.

Subsequently, referring to FIG. 4A, an organic electroluminescent device is completed by forming patterns a, b and c of an organic film having certain cycles on an upper portion of a substrate 200 and forming an upper electrode, not illustrated in FIG. 4A, on an upper portion of the organic layer pattern formed substrate 200.

Furthermore, an organic electroluminescent display device having an improved opening ratio can be fabricated by sealing the organic electroluminescent device.

A laser irradiation apparatus according to the present invention is capable of preventing drop of picture quality due to the formation of opening defects and uneven organic layer patterns on a portion of the pixel portion by using a mask in which a portion including an apex on one side of mask pattern is reinforced.

While the present invention has been particularly shown and described with reference to exemplary embodiments thereof, it will be understood by those skilled in the art that the foregoing and other modifications in form and detail can be made therein without departing from the spirit and scope of the present invention as defined by the following claims.

What is claimed is:

1. A Laser Induced Thermal a (LITI) mask, comprising:
a first pattern portion; and
a second pattern portion arranged on a portion eluding an apex on at least one side of the first pattern portion;
wherein the second pattern portion has area in a range of 8 to 8,500 $\mu m^2$.

2. The LITI mask according to claim 1, wherein the second pattern portion is projected 2 to 30 $\mu m$ from the portion that includes the apex on at least one side of the first pattern portion.

3. The LITI mask according to claim 1, wherein a length of one surface of the second pattern portion is in a range of 4 to 60 $\mu m$.

4. The LITI mask according to claim 1, wherein the second pattern portion surrounds the apex of the first pattern portion.

5. The LITI mask according to claim 1, wherein the second pattern portion has a curved shape.

6. The LITI mask according to claim 5, wherein the second pattern portion has a circular shape having a radius in a range of 4 to 60 $\mu m$ and centered around the apex of the first pattern portion.

7. The LITI mask according to claim rein ask is applied to a LITI device equipped with an equal-magnification projection lens.

8. The LITI ask according to claim 1, wherein the LITI ask has one of a stripe, mosaic or delta shape.

9. A method of employing the LITI mask of claim 1 for fabricating an organic electroluminescent device, comprising:
forming a first electrode on a substrate;
laminating a donor substrate onto an upper portion of the first electrode formed on the substrate;

forming an organic layer pattern by irradiating laser beam passing through the LITI mask including the first pattern portion; and the second pattern portion arranged on the portion including the apex on at least one side of the first pattern portion; and forming a second electrode on an upper portion of the, organic layer pattern; wherein a reinforced region having an area in a range of 8 to 8,500 µm$^2$ is formed on a portion including an apex on at least one side of the organic layer pattern.

10. A Laser Induced Thermal Imaging (LITI) mask, comprising:

a first pattern portion; and a second pattern portion arranged on a portion including an apex on at least one side of the first pattern portion;

wherein the second pattern portion has length in a range of 2 to 30 µm from the portion that includes the apex on at least one side of the first pattern portion.

11. The LITI mask according to claim 10, wherein the second pattern portion has length in a range of 4 to 60 µm.

12. The LITI mask according to claim 10, wherein the LITI mask is applied to a LITI device equipped with an equal-magnification projection lens.

13. The LITI mask according to claim 10, wherein the LITI mask has one of a stripe, mosaic or delta shape.

14. A method of fabricating an organic electroluminescent device, comprising:

forming a first electrode on a substrate;

laminating a donor substrate onto an upper portion of the first electrode formed on the substrate;

forming an organic layer pattern by irradiating a laser beam passing through a Laser Induced Thermal Imaging (LITI) mask including a first pattern portion; and a second pattern portion arranged on a portion including an apex on at least one side of the first pattern portion; wherein the second pattern portion has area in a range of 8 to 8,500 µm$^2$ on the donor substrate; and forming a second electrode on an upper portion of the organic layer pattern; wherein a reinforced region having an area in a range of 8 to 8,500 µm$^2$ is formed on a portion including an apex on at least one side of the organic layer pattern.

15. The method according to claim 14, wherein the organic layer pattern is formed with a laser generator and a laser irradiation apparatus including an equal-magnification projection lens.

16. The method according to claim 15, wherein the organic layer pattern is formed in a pattern shape of the LITI mask.

17. An organic electroluminescent device, comprising:

forming a first electrode on a substrate;

forming an organic layer pattern including at least an emitting layer on the first electrode; and forming a second electrode on the organic layer pattern, forming a reinforced region having an area in a range of 8 to 8,500 µm$^2$ on a portion including an apex on at least one side of the organic layer pattern.

18. A method of fabricating an organic electroluminescent device comprising:

forming a first electrode on a substrate;

laminating a donor substrate onto an upper portion of the first electrode formed on the substrate;

forming an organic layer pattern by irradiating a laser beam passing through the Laser Induced Thermal Imaging (LITI) mask including: a first pattern portion; and a second pattern portion arranged on a portion including an apex on at least one side of the first pattern portion; wherein the second pattern portion has area in a range of 8 to 8,500 µm$^2$ on the donor substrate and wherein a length of one surface of the second pattern portion is in a range of 4 to 60 µm; and forming a second electrode on an upper portion of the organic layer pattern; wherein a reinforced region having an area in a range of 8 to 8,500 µm$^2$ is formed on a portion including an apex on at least one side of the organic layer pattern.

19. The method according to claim 18, wherein the organic layer pattern is formed with a laser generator and a laser irradiation apparatus including an equal-magnification projection lens.

20. The method according to claim 19, wherein the organic layer pattern is formed in a pattern shape of the LITI mask.

* * * * *